(12) United States Patent
Shindo et al.

(10) Patent No.: US 10,296,050 B2
(45) Date of Patent: May 21, 2019

(54) ELECTRONIC DEVICE

(71) Applicant: Panasonic Intellectual Property Management Co., Ltd., Osaka (JP)

(72) Inventors: Kenichi Shindo, Osaka (JP); Takeshi Mori, Osaka (JP); Futoshi Kuriyama, Saga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/948,857

(22) Filed: Apr. 9, 2018

(65) Prior Publication Data

US 2018/0224896 A1 Aug. 9, 2018

Related U.S. Application Data

(63) Continuation of application No. PCT/JP2016/003472, filed on Jul. 27, 2016.

(30) Foreign Application Priority Data

Nov. 6, 2015 (JP) .................................. 2015-218842

(51) Int. Cl.
*G06F 1/16* (2006.01)
*H05K 5/03* (2006.01)
(Continued)

(52) U.S. Cl.
CPC .............. *G06F 1/1656* (2013.01); *G06F 1/16* (2013.01); *G06F 1/1626* (2013.01);
(Continued)

(58) Field of Classification Search
CPC ........ G06F 1/1656; G06F 1/1626; G06F 1/16; H05K 5/0239; H05K 5/03; H05K 5/02; H01R 13/5213
(Continued)

(56) References Cited

U.S. PATENT DOCUMENTS 8,345,421 B2 * 1/2013 Tai ........................ G06F 1/181
292/DIG. 37
8,611,073 B2 * 12/2013 Murakata ............. H05K 5/0086
220/811
(Continued)

FOREIGN PATENT DOCUMENTS

JP 09-126211 A 5/1997
JP 2009-238735 A 10/2009
(Continued)

OTHER PUBLICATIONS

International Search Report for corresponding International App. No. PCT/JP2016/003472, dated Sep. 13, 2016.

*Primary Examiner* — Rockshana D Chowdhury
(74) *Attorney, Agent, or Firm* — Renner Otto Boisselle & Sklar, LLP

(57) ABSTRACT

An electronic device includes a terminal cover that closes an opening. The opening is provided in a casing and houses a connection terminal. The terminal cover includes a lid, a fixing part for fixing the lid to the casing, and a slider mounted on the lid and slidable in a predetermined sliding direction. The lid is coupled to the fixing part in the sliding direction. The slider has first engagement parts provided at an end of the slider in the sliding direction, and has second engagement parts provided at each end in a direction orthogonal to the sliding direction. When the slider is located at a predetermined lock position in a state in which the terminal cover is closed, the casing has third engagement parts engaged with the first engagement parts and fourth engagement parts engaged with the second engagement parts.

8 Claims, 18 Drawing Sheets

(51) Int. Cl.
*H01R 13/52* (2006.01)
*H05K 5/02* (2006.01)

(52) U.S. Cl.
CPC ....... *H01R 13/5213* (2013.01); *H05K 5/0239* (2013.01); *H05K 5/03* (2013.01)

(58) Field of Classification Search
USPC .................................................... 361/679.55
See application file for complete search history.

(56) References Cited

U.S. PATENT DOCUMENTS

| | | | | |
|---|---|---|---|---|
| 8,913,374 B2* | 12/2014 | Wu | ............... | H05K 5/00 361/679.01 |
| 2005/0000774 A1 | 1/2005 | Axelrod | | |
| 2005/0007747 A1* | 1/2005 | Axelrod | ............... | H05K 5/0013 361/752 |
| 2009/0219676 A1 | 9/2009 | Murakata | | |
| 2011/0255229 A1 | 10/2011 | Murakata | | |
| 2013/0286569 A1 | 10/2013 | Murakata | | |
| 2015/0230356 A1 | 8/2015 | Shinoda | | |

FOREIGN PATENT DOCUMENTS

| | | |
|---|---|---|
| JP | 2015-015579 A | 1/2015 |
| JP | 2015-153865 A | 8/2015 |

* cited by examiner

ELECTRONIC DEVICE

BACKGROUND

1. Technical Field

The present disclosure relates to an electronic device including a terminal cover having waterproof and dust-proof properties.

2. Description of the Related Art

PTL 1 discloses a water sealing structure relating to an opening/closing mechanism that opens/closes a lid covering a connection terminal of an electronic device, such as a smartphone. Specifically, PTL 1 discloses the water sealing structure having a body member, a lid member, a guide member, a shaft, a first biasing part, a second biasing part, and a lock member. The body member has an opening. The lid member includes a water sealing member for sealing the opening. The guide member is provided in the body member, and has a shaft hole including a circular hole and a long hole communicating with the circular hole. The shaft is provided in the lid member, supported by the shaft hole, and rotated within the circular hole. The rotation of the shaft is regulated within the long hole, and the shaft is guided to the body member side. The first biasing member biases the shaft in a removing direction away from the body member. The second biasing member biases the shaft in a rotating direction. The lock member locks the lid member to the body member in a state in which the water sealing member seals the opening. This water sealing structure can suppress reduction in water sealing performance due to an impact when an operator closes a cover.

CITATION LIST

Patent Literature

PTL 1: Unexamined Japanese Patent Publication No. 2015-153865

SUMMARY

The present disclosure relates to an electronic device including a terminal cover having waterproof and dust-proof properties of a connection terminal.

An aspect of the present disclosure provides an electronic device including: a casing having an opening that houses a connection terminal inside; and a terminal cover that closes the opening such that the connection terminal is not exposed. The terminal cover includes a lid that closes the opening, a fixing part for fixing the lid to the casing, and a slider mounted on the lid and slidable in a predetermined sliding direction. The lid is coupled to the fixing part in the predetermined sliding direction. The slider has first engagement parts provided at an end of the slider in the predetermined sliding direction and second engagement parts provided at each of two ends of the slider in a direction orthogonal to the predetermined sliding direction. When the slider is located at a predetermined lock position in a state in which the terminal cover is closed, the casing has third engagement parts engaged with the first engagement parts and fourth engagement parts engaged with the second engagement parts.

According to the present disclosure, since the terminal cover can be fixed to the casing in the plurality of places in the electronic device, airtightness, that is, waterproof and dust-proof properties, of the terminal cover can be enhanced.

DETAILED DESCRIPTION

Hereinafter, exemplary embodiments are described in detail with reference to the drawings as appropriate. However, detailed description beyond necessity may be omitted. For example, detailed description of a matter that has been already known well or overlapping description of substantially the same configuration may be omitted. This is to avoid unnecessary redundancy of the following description and to facilitate understanding by those skilled in the art.

Note that the inventors of the present disclosure provide the attached drawings and the following description for those skilled in the art to fully understand the present disclosure, and do not intend to limit the subject matter as described in the appended claims by these drawings and description.

First Exemplary Embodiment

[1-1. Entire Configuration]

Figure 1:
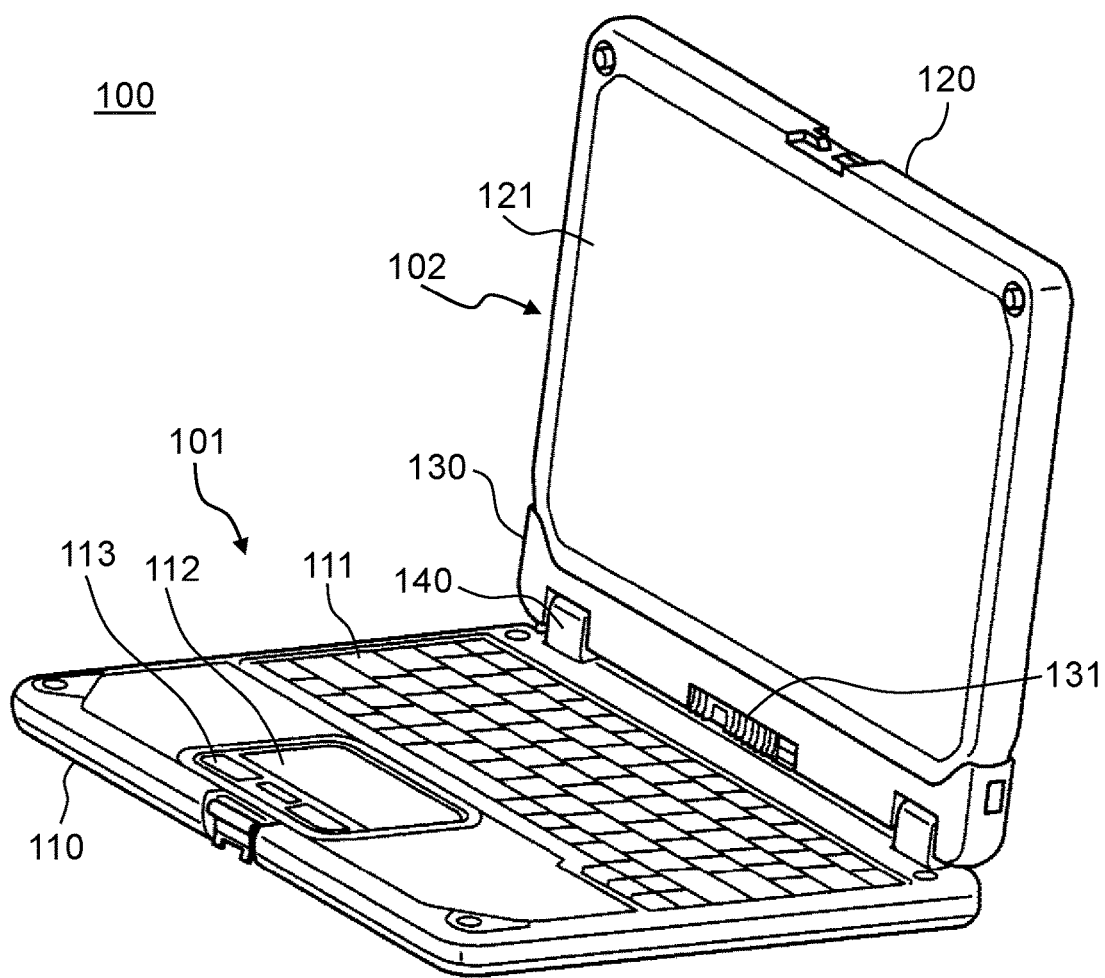
FIG. 1 is a perspective view of an information processing device according to a first exemplary embodiment of the present disclosure.
Figure 1:
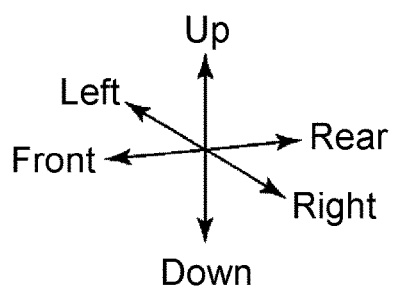

FIG. 1 is a perspective view of an information processing device according to a first exemplary embodiment of the present disclosure. The information processing device serves as an example of an electronic device.

As shown in FIG. 1, information processing device 100 includes first unit 101 and second unit 102. Second unit 102 is detachable from first unit 101. In a case where second unit 102 is attached to first unit 101, information processing device 100 can be utilized as a notebook type computer. Second unit 102 can be utilized alone as a tablet type computer. In this way, information processing device 100 is a so-called detachable type computer.

Second unit 102 has a function as the tablet type computer. Second unit 102 includes display 121. Display 121 is configured, for example, with a liquid crystal display device, and is mounted on one principal surface of second casing 120. Display 121 may be configured with another display device, such as an organic EL device. Display 121 is provided with a touch panel disposed on the liquid crystal display device and capable of receiving user's touch operation. In order to realize the function as the computer, second unit 102 incorporates a central processing unit (CPU), a volatile storage (RAM), a nonvolatile storage (ROM, SSD, or the like), a battery, and the like. The nonvolatile storage (ROM, SSD, or the like) stores an operating system (OS), various application programs, various data, and the like. The central processing unit (CPU) executes arithmetic processing by reading the OS, the application programs, and the various data, thereby realizing various functions.

First unit 101 includes first casing 110, holder 130, and hinge 140. First casing 110 is formed of metal, such as magnesium alloy, or resin. First unit 101 includes an input part through which the user performs input operation on the second unit. As the input part, first casing 110 is provided with keyboard 111, touch pad 112, operation buttons 113, and the like.

Holder 130 is electrically or mechanically connected with first unit 101. Holder 130 attaches second unit 102 by housing a part of second unit 102. When second unit 102 is attached, holder 130 electrically connects first unit 101 with second unit 102.

Hinge 140 couples holder 130 and first unit 101 such that holder 130 (i.e., second unit 102) can rotate with respect to first unit 101.

A connector (not shown) connected with a connector (not shown) of the second unit is provided within holder 130. Further, wiring for exchanging various signals or electric power between holder 130 and first unit 101 is passed through an inside of hinge 140. Various signals and electric power can be given and received between first unit 101 and second unit 102 via these connectors and wiring.

Figure 2:
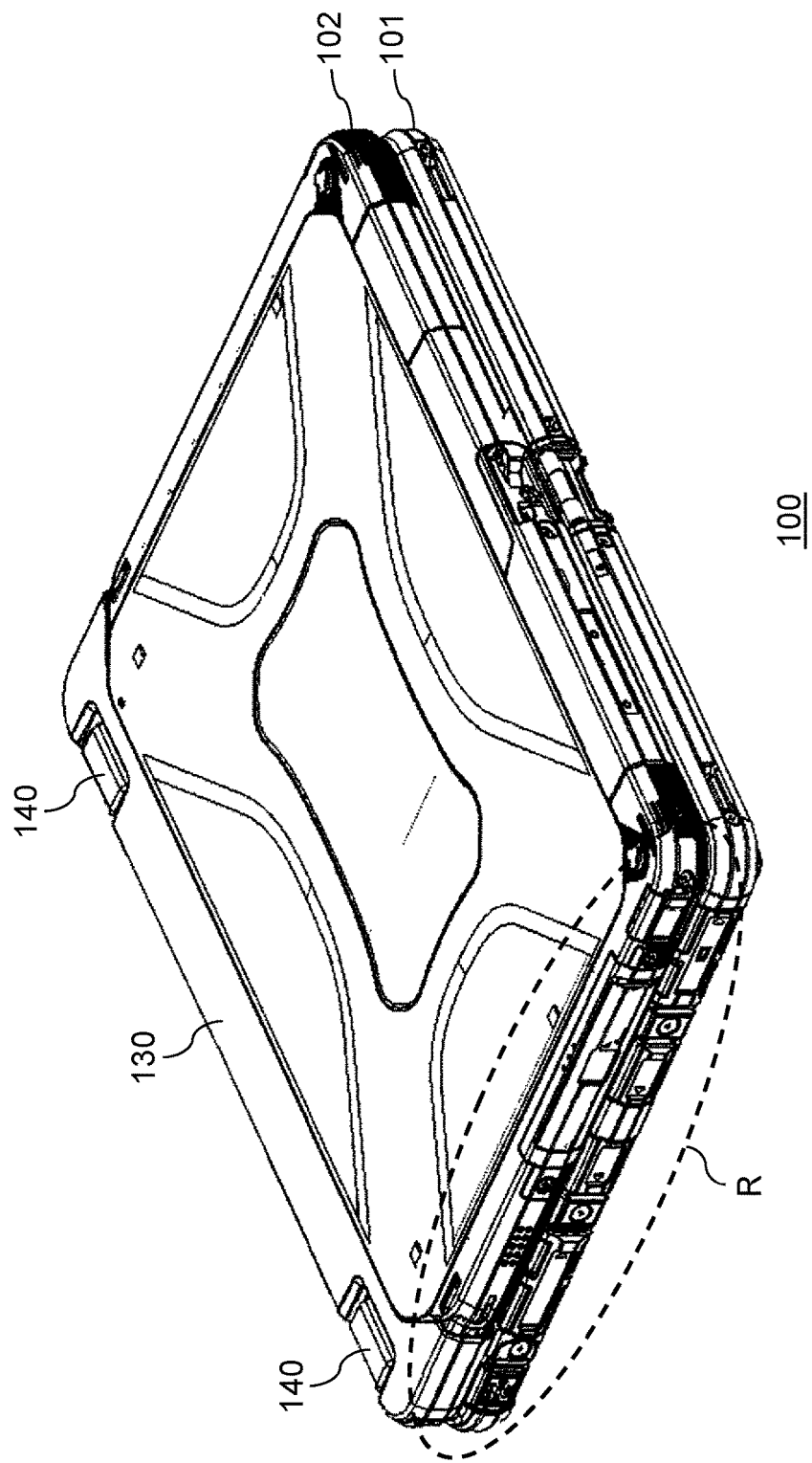
FIG. 2 is a perspective view of the information processing device in a state in which a second unit is closed with respect to a first unit.
Figure 3:
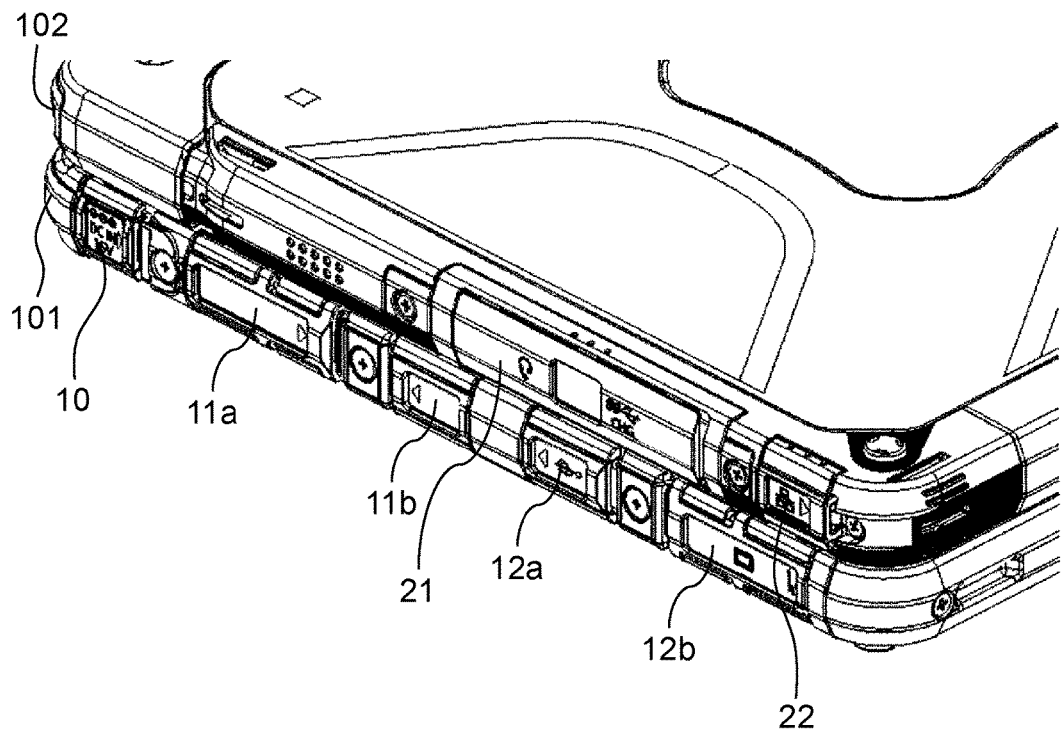
FIG. 3 is a view explaining various connection terminals disposed on a side surface of the information processing device.

FIG. 2 is a perspective view of information processing device 100 in a state in which second unit 102 is closed with respect to first unit 101. As shown in FIG. 2, connection terminals and slots to which a power supply plug, an external device, a memory card, and the like are connected are provided on each side surface (region R) of first unit 101 and second unit 102. FIG. 3 is an enlarged view of a portion of the side surface provided with the connection terminals in information processing device 100.

Specifically, first unit 101 is provided with a terminal for the power supply plug, a memory card slot (a terminal for the memory card), an HDMI terminal, a USB terminal, and a display terminal. Further, second unit 102 is provided with a memory card slot (a terminal for the memory card), an earphone/microphone terminal, a USB terminal, an HDMI terminal, and a LAN terminal.

The respective connection terminals are provided with terminal covers 10 to 12, 21 and 22 such that the connection terminals are not exposed when the connection terminals are not used. Terminal covers 10 to 12, 21 and 22 are formed of a resin material. For example, terminal cover 10 is provided for the terminal for the power supply plug in first unit 101. Terminal cover 11a is provided for the memory card slot that houses the terminal for the memory card inside. Terminal cover 11b is provided for the HDMI terminal. Further, terminal covers 12a and 12b are respectively provided for the USB terminal and the display terminal. Second unit 102 is provided with one terminal cover 21 for the memory card slot, the USB terminal, the earphone/microphone terminal, and the HDMI terminal. Further, terminal cover 22 is provided for the LAN terminal.

[1-2. Terminal Cover]

[1-2-1. One Terminal Cover in First Unit]

Figure 4:
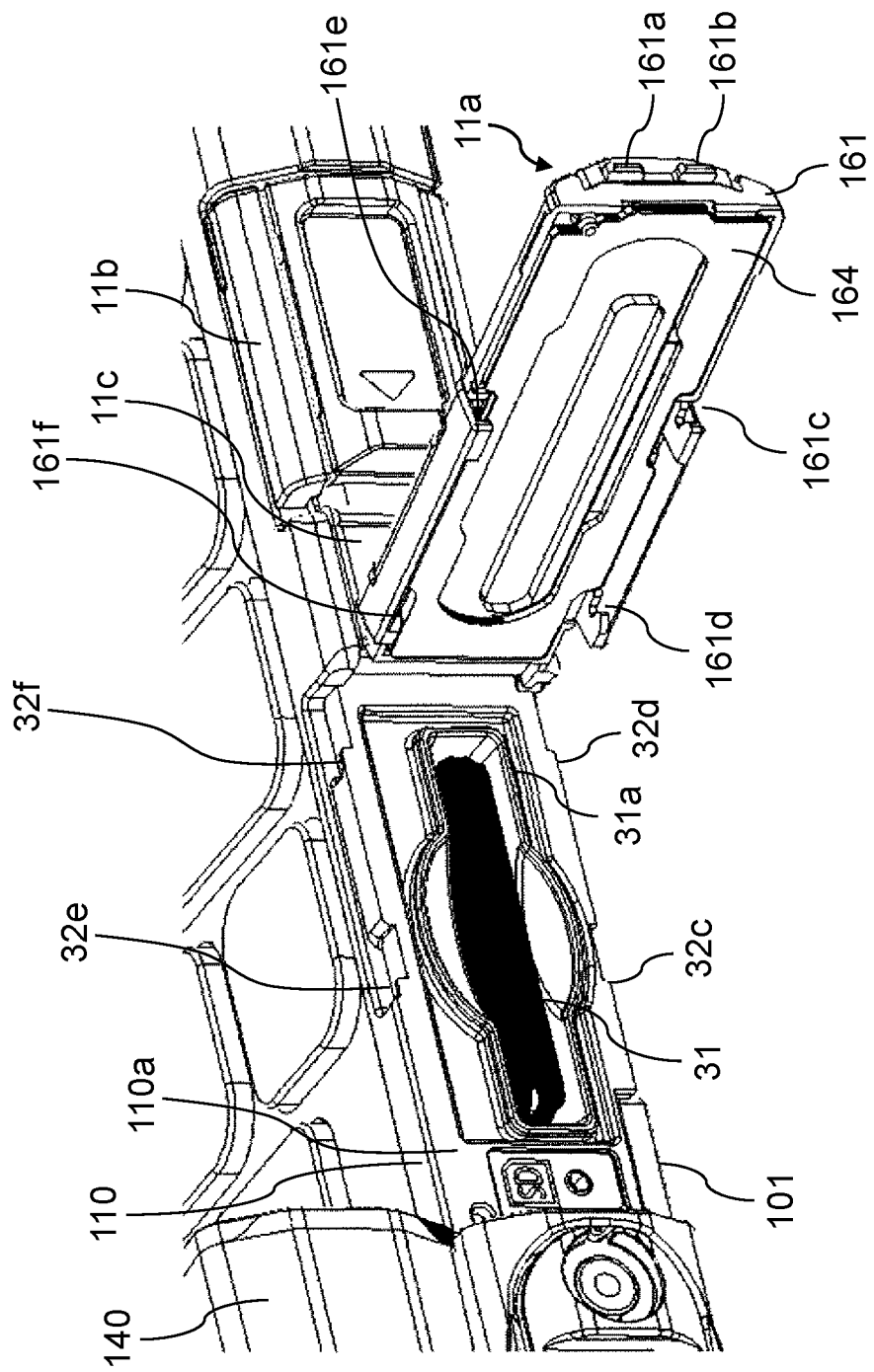
FIG. 4 is a view showing a state of a memory card slot when a terminal cover for a memory card slot is opened.
Figure 5:
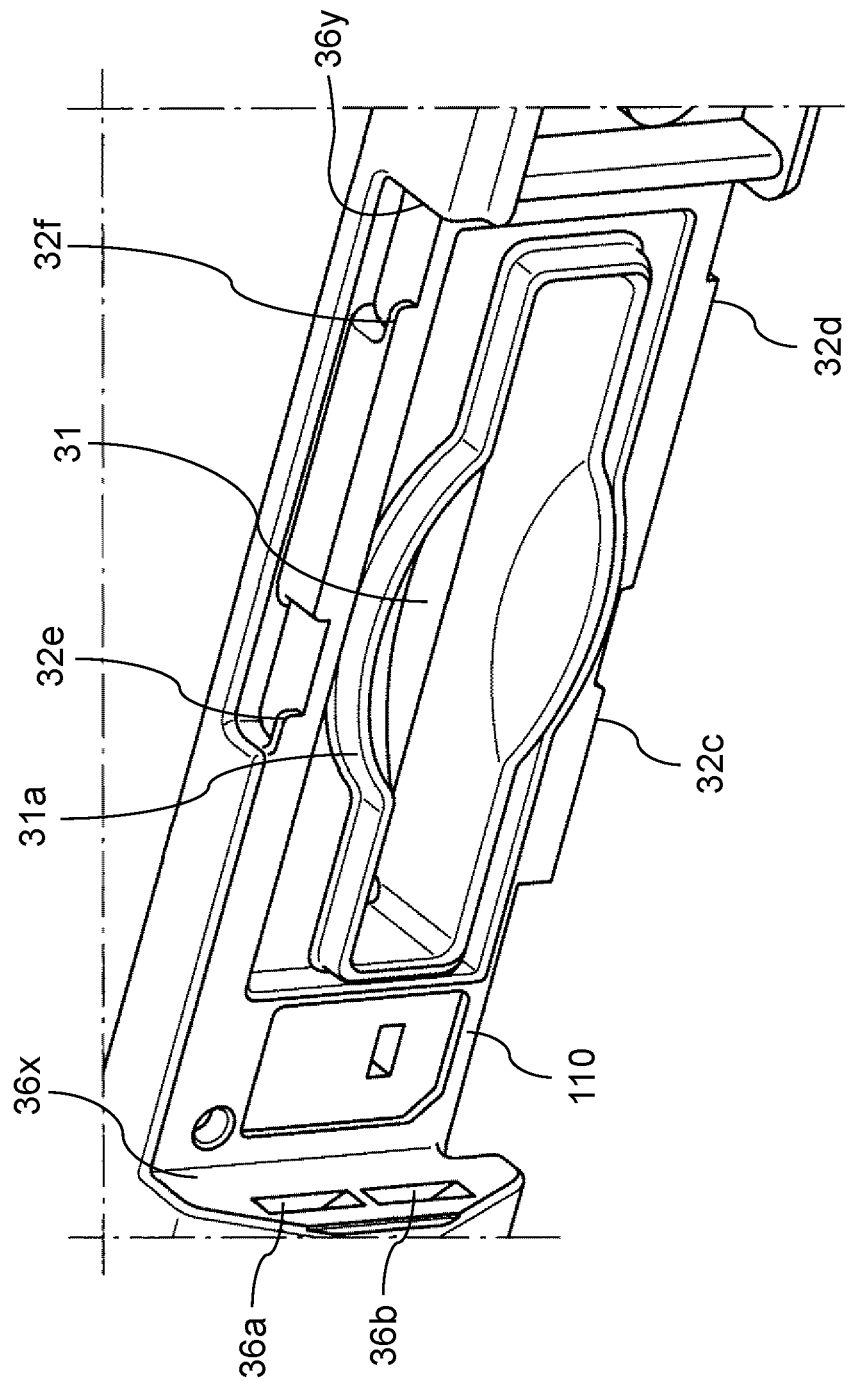
FIG. 5 is a view showing the memory card slot and a region near the memory card slot in a state in which the terminal cover for the memory card slot is removed.
Figure 6:
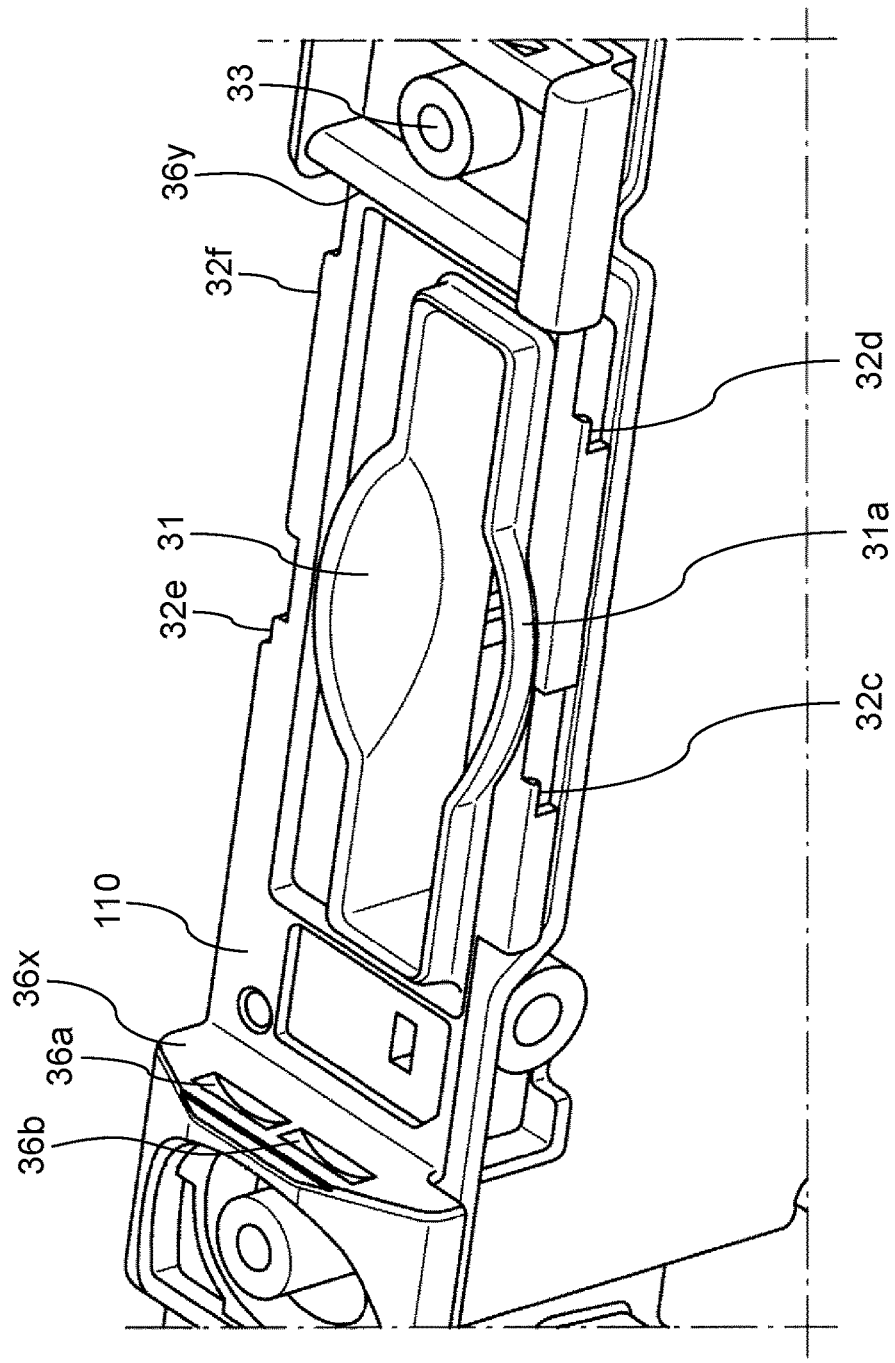
FIG. 6 is a view showing the memory card slot and the region near the memory card slot in the state in which the terminal cover for the memory card slot is removed.

FIG. 4 is a view explaining a region near the memory card slot, into which the memory card is inserted, in first unit 101 of information processing device 100. The connection terminal for the memory card is disposed at a back of memory card slot 31. FIG. 4 shows a state in which terminal cover 11a is opened and memory card slot 31 is exposed. FIGS. 5 and 6 are views each showing the region near the memory card slot in a state in which terminal cover 11a is removed.

As shown in FIGS. 4 to 6, rib 31a is provided around memory card slot 31 (an opening). When terminal cover 11a is closed, this rib 31a abuts on a water sealing member provided inside terminal cover 11a. Accordingly, the opening of memory card slot 31 is sealed (details are described below).

Further, in first casing 110, projections 32e, 32f are formed in a region above memory card slot 31, and projections 32c, 32d are formed in a region below memory card slot 31. Projections 32e, 32f and 32c, 32d are plate-shaped projections that extend in a direction parallel to surface 110a formed with memory card slot 31.

Further, screw hole 33 for screwing and fixing terminal cover 11a, 11b is formed in a lateral region on an HDMI terminal side of memory card slot 31. In both side regions of memory card slot 31, wall 36x, wall 36y that steeply rise at a right angle from surface 110a formed with memory card slot 31 are formed opposite to each other. Also, two lock holes 36a, 36b are provided on wall 36x that is farther from screw hole 33. Projections 32c to 32f and lock holes 36a, 36b provided around memory card slot 31 are disposed for locking terminal cover 11a to first unit 101 (details are described below).

Figure 7:
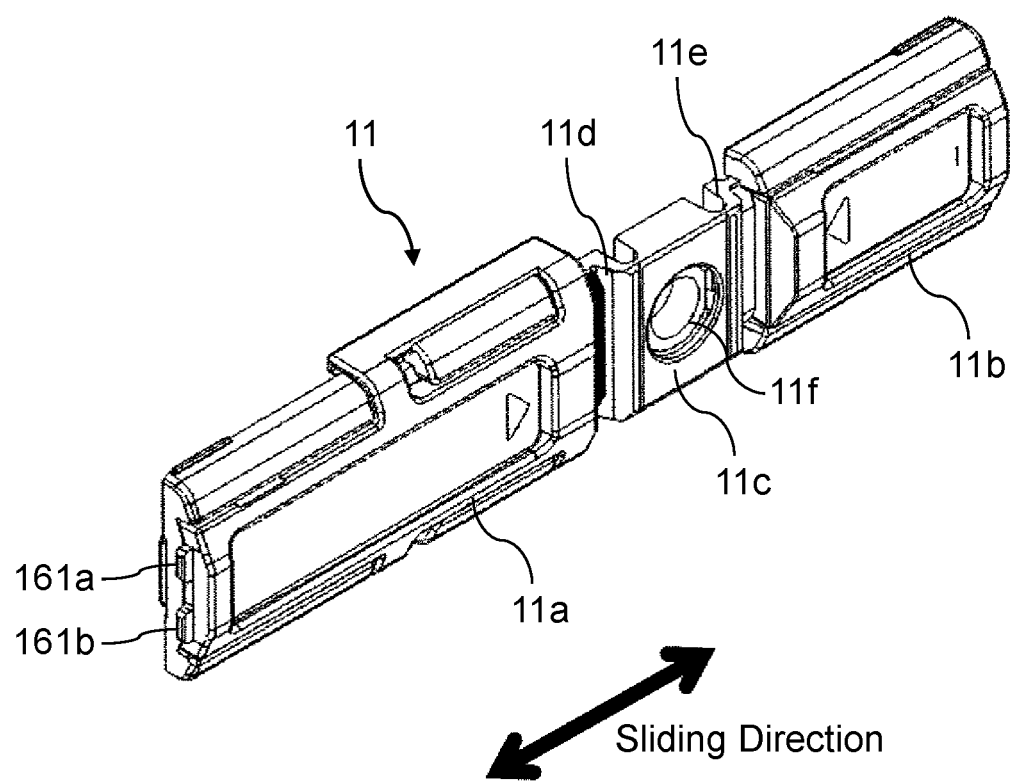
FIG. 7 is a perspective view (a front side) of a coupling cover that couples the terminal cover for the memory card slot to a terminal cover for an HDMI (registered trademark, the same applies hereinafter) terminal.

FIG. 7 is a perspective view of terminal cover 11a that covers the memory card slot and terminal cover 11b that covers the HDMI terminal. As shown in FIG. 7, terminal cover 11a that covers the memory card slot and terminal cover 11b that covers the HDMI terminal are coupled and integrally formed via fixing part 11c. Fixing part 11c has curved hinge 11d connected with terminal cover 11a and curved hinge 11e connected with terminal cover 11b. Fixing part 11c further has opening 11f in a center. By fastening a screw into screw hole 33 of first unit 101 via this opening 11f, coupling cover 11 is fixed to first unit 101. In the following description, a member integrally formed with terminal cover 11a and terminal cover 11b is referred to as "coupling cover" 11.

Figure 8:
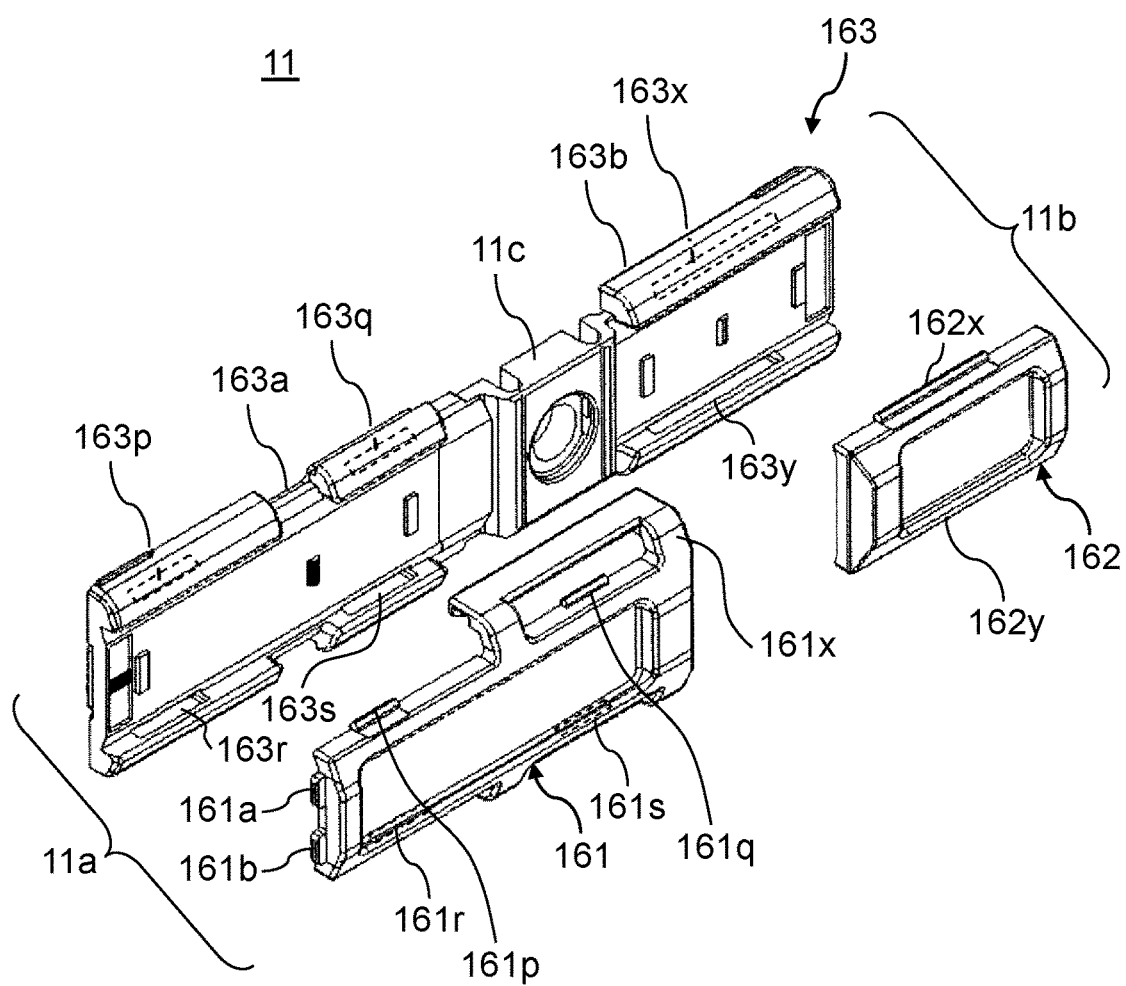
FIG. 8 is a perspective view (the front side) of the coupling cover.
Figure 9:
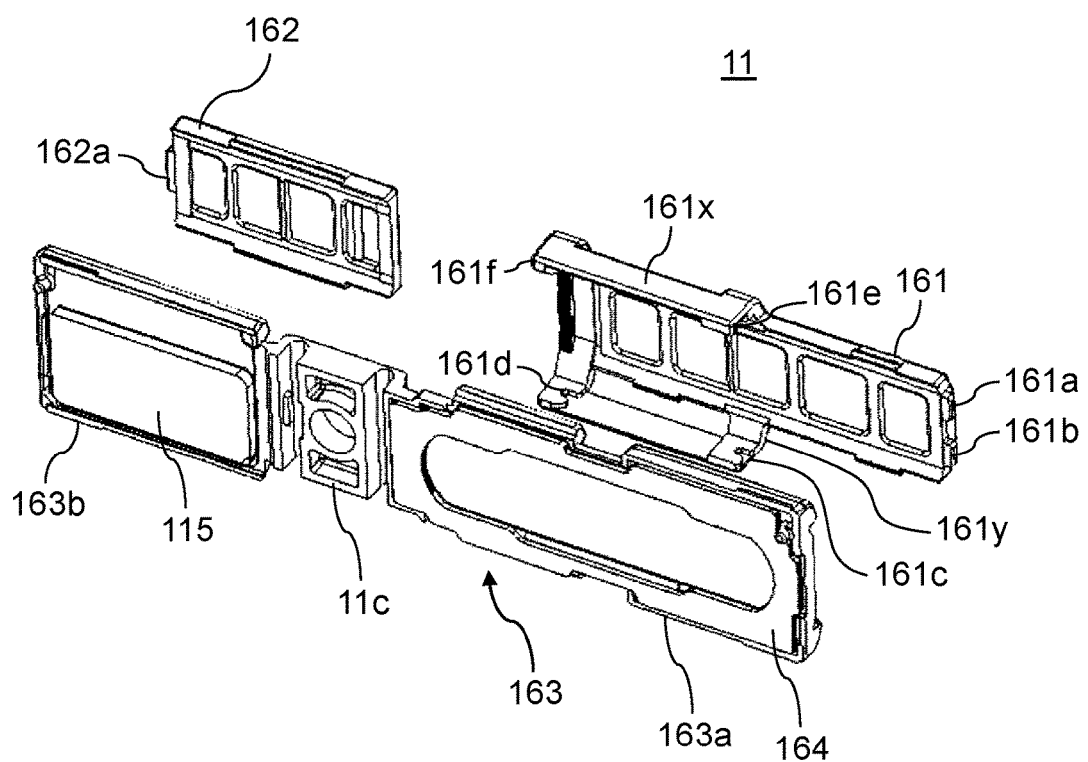
FIG. 9 is a developed view (a view as seen from a back side) of the coupling cover.

FIG. 8 is a perspective view of coupling cover 11 as seen from a front side, and FIG. 9 is a developed view of coupling cover 11 as seen from a back side. Coupling cover 11 is configured with two sliders 161, 162 and base member 163. Base member 163 includes first lid 163a and second lid 163b. First lid 163a and second lid 163b are coupled by fixing part 11c.

Terminal cover 11a includes slider 161 and first lid 163a, and slider 161 is slidably mounted on first lid 163a. As shown in FIG. 8, two protrusions are provided at each of both ends in a width direction of first lid 163a. Grooves 163p, 163q, 163r, 163s that extend in a longitudinal direction of first lid 163a are formed in the respective protrusions.

On the other hand, slider 161 is also provided with projections 161p, 161q, 161r, 161s at positions corresponding to respective grooves 163p, 163q, 163r, 163s. Slider 161 and first lid 163a are combined by engagement between the projections and the grooves corresponding to each other. Lengths of respective grooves 163p, 163q, 163r, 163s are set longer than lengths of projections 161p, 161q, 161r, 161s. With this configuration, slider 161 can slide on first lid 163a. Further, projections 161a, 161b are provided at one end in a longitudinal direction of slider 161 (an end that is not an end on fixing part 11c side).

Terminal cover 11b includes slider 162 and second lid 163b, and slider 162 is slidably mounted on second lid 163b. As shown in FIG. 8, protrusions are respectively provided at both ends in a width direction of second lid 163b. Grooves 163x, 163y that extend in a longitudinal direction of second lid 163b are formed in the respective protrusions.

On the other hand, slider 162 is also provided with projections 162x, 162y, at positions corresponding to respective grooves 163x, 163y. Slider 162 and second lid 163b are combined by engagement between the projections and the grooves corresponding to each other. Lengths of respective grooves 163x, 163y are set longer than lengths of projections 162x, 162y. With this configuration, slider 162 can slide on second lid 163b. Further, pawl 162a is provided at one end in a longitudinal direction of slider 162 (an end that is not an end on fixing part 11c side).

Figure 10:
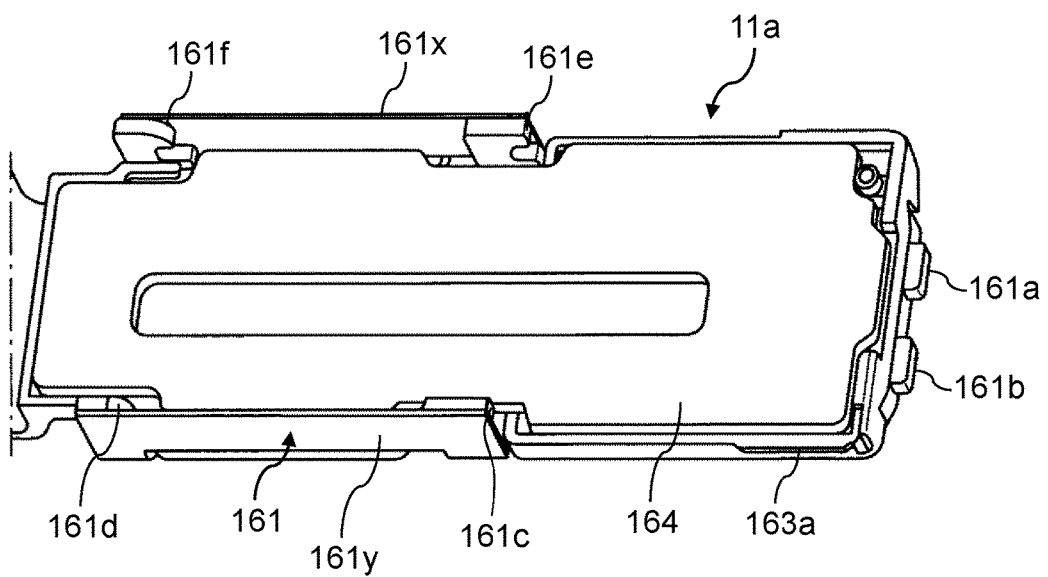
FIG. 10 is a perspective view (a view as seen from the back side) of the terminal cover for the memory card slot.

FIG. 10 is a view of a portion of terminal cover 11a of coupling cover 11 as seen from the back side. Terminal cover 11a (slider 161) includes, at both ends in a width direction, protrusions 161x, 161y that protrude opposite to each other in a direction orthogonal to a principal surface of terminal cover 11a. Respective protrusions 161x, 161y have U-shaped engagement parts 161e and 161f, and 161c and 161d at both ends in a longitudinal direction. Engagement parts 161e and 161f, and 161c and 161d have U-shaped cut-away parts. Engagement parts 161e and 161f formed in protrusion 161x are formed so as to protrude in a direction toward other protrusion 161y. Similarly, engagement parts 161c and 161d formed in protrusion 161y are formed so as to protrude in a direction toward other protrusion 161x. Since engagement parts 161c to 161f are formed in this way, an increase in a length in the width direction of terminal cover 11a by the engagement parts can be suppressed.

Further, in first lid 163a of terminal cover 11a, water sealing member 164 formed of urethane rubber or the like is mounted on a surface opposite to casing 110 of the first unit (see FIGS. 9 and 10). Similarly, in second lid 163b of terminal cover 11b, water sealing member 115 formed of urethane rubber or the like is also mounted on a surface opposite to casing 110 of the first unit. When terminal covers 11a, 11b are closed, these water sealing members 164, 115 are in close contact with ribs formed around the openings that house the connection terminals. Accordingly, the openings are sealed, and waterproof and dust-proof functions are realized.

A lock function of terminal cover 11a having the above-described configuration is described.

In a state in which terminal cover 11a is completely closed with respect to first casing 110 in first unit 101 (see FIGS. 2 and 3), slider 161 is slid in the longitudinal direction so as to move away from fixing part 11c. Accordingly, terminal cover 11a can be locked.

Specifically, projections 161a, 161b of slider 161 are moved and inserted into lock holes 36a, 36b provided in first casing 110 by sliding slider 161 in the longitudinal direction. With this configuration, terminal cover 11a is fixed to first casing 110 at the one end in the longitudinal direction. At this time, four engagement parts 161c, 161d, 161e, 161f provided in protrusions 161x, 161y of slider 161 are moved toward projections 32c, 32d, 32e, 32f provided in first casing 110. Then, projections 32c, 32d, 32e, 32f of first casing 110 are eventually inserted in recesses of engagement parts 161c, 161d, 161e, 161f. With this configuration, terminal cover 11a is fixed to first casing 110 in a plurality of places at the ends in the width direction.

Figure 11:
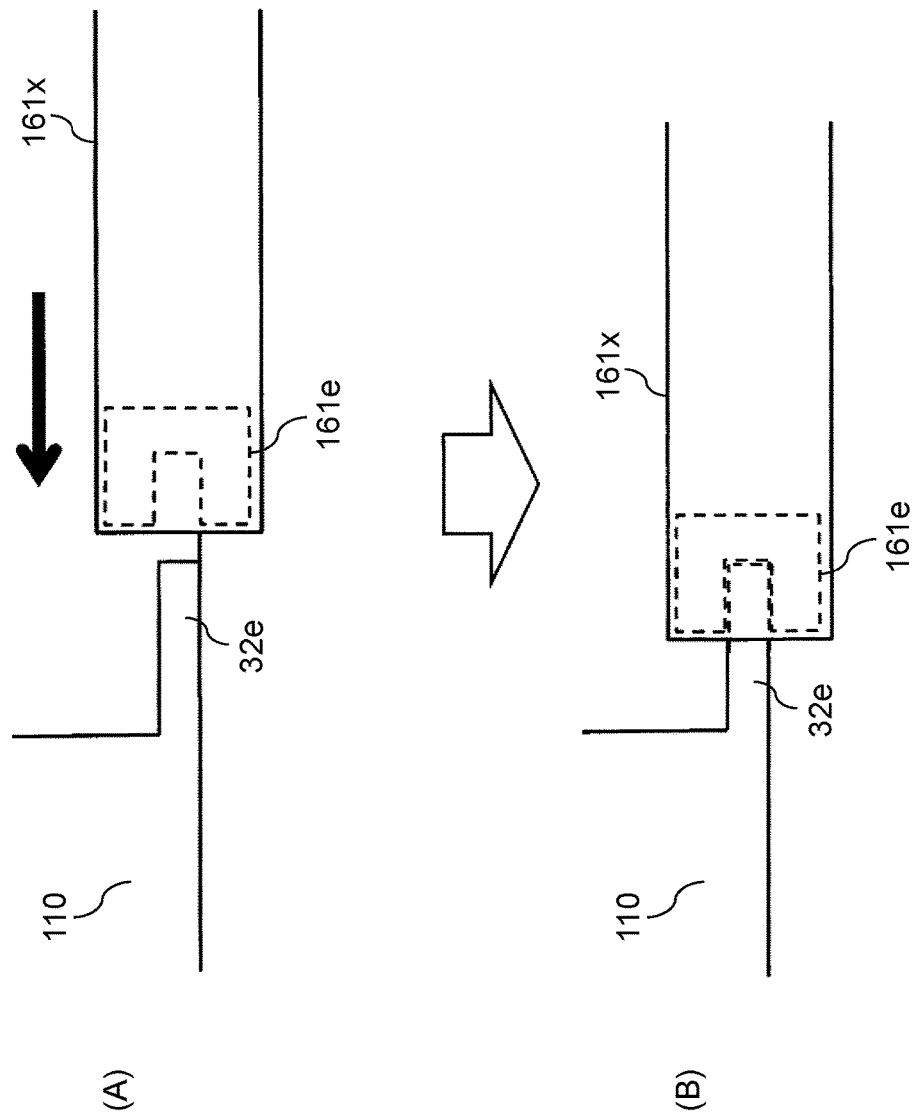
FIG. 11 is a view for explaining lock operation of the terminal cover for the memory card slot.

FIG. 11 is a view explaining a state in which engagement part 161e of protrusion 161x of slider 161 and projection 32e of first casing 110 are engaged with the movement of slider 161. As shown in FIG. 11 (A), protrusion 161x of slider 161 is moved toward projection 32e by the movement of slider 161. Then, as shown in FIG. 11 (B), engagement part 161e of protrusion 161x is eventually engaged with projection 32e of first casing 110. With this configuration, terminal cover 11a is fixed to first casing 110.

As described above, since terminal cover 11a is fixed to first casing 110 in the plurality of places at the ends in the longitudinal direction and the width direction, terminal cover 11a is fixed to first casing 110 more firmly. Hence, it is possible to realize higher waterproof and dust-proof properties.

It should be noted that in the state in which terminal cover 11a is completely closed with respect to first casing 110 of the first unit (see FIGS. 2 and 3), water sealing member 164 mounted on terminal cover 11a and rib 31a provided around memory card slot 31 are in close contact with each other. With this configuration, memory card slot 31 (the opening) is sealed, and waterproof and dust-proof properties are secured.

In the above-described example, terminal cover 11a is coupled with terminal cover 11b. However, it is not necessary that terminal cover 11a is formed by coupling with another terminal cover. Further, terminal cover 11a covers only one connection terminal. However, terminal cover 11a may cover a plurality of connection terminals.

[1-2-2. One Terminal Cover in Second Unit]

Figure 12:
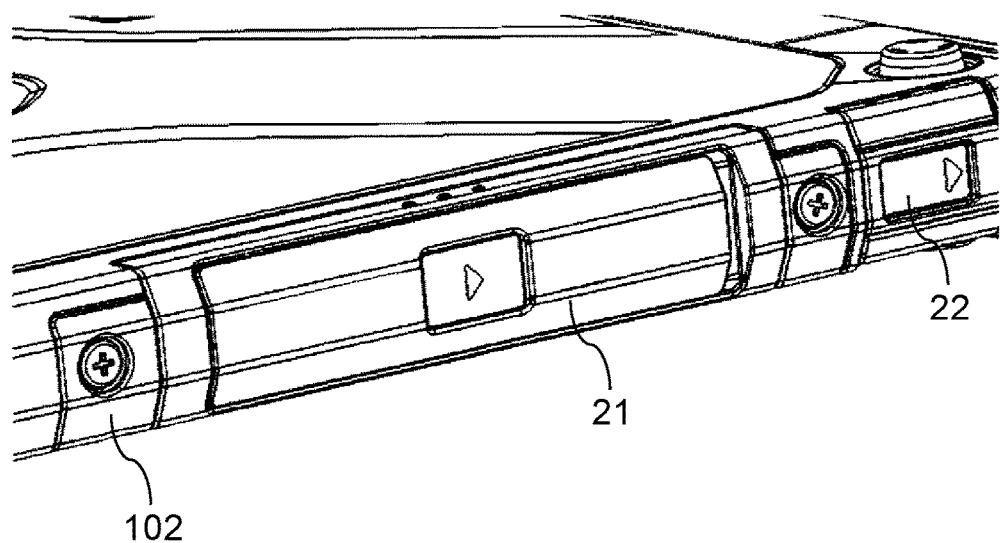
FIG. 12 is a view showing a composite cover provided on a second unit side of the information processing device.

Terminal cover 21 provided in second unit 102 is described below. FIG. 12 is a view showing a side surface of second unit 102 provided with the various connection terminals. The memory card slot, the earphone/microphone terminal, the USB terminal, the HDMI terminal, and the LAN terminal are provided on the side surface of second unit 102. The memory card slot, the earphone/microphone terminal, the USB terminal, and the HDMI terminal are covered with one terminal cover 21 (hereinafter referred to as a "composite cover"). The LAN terminal is covered with terminal cover 22.

Figure 13:
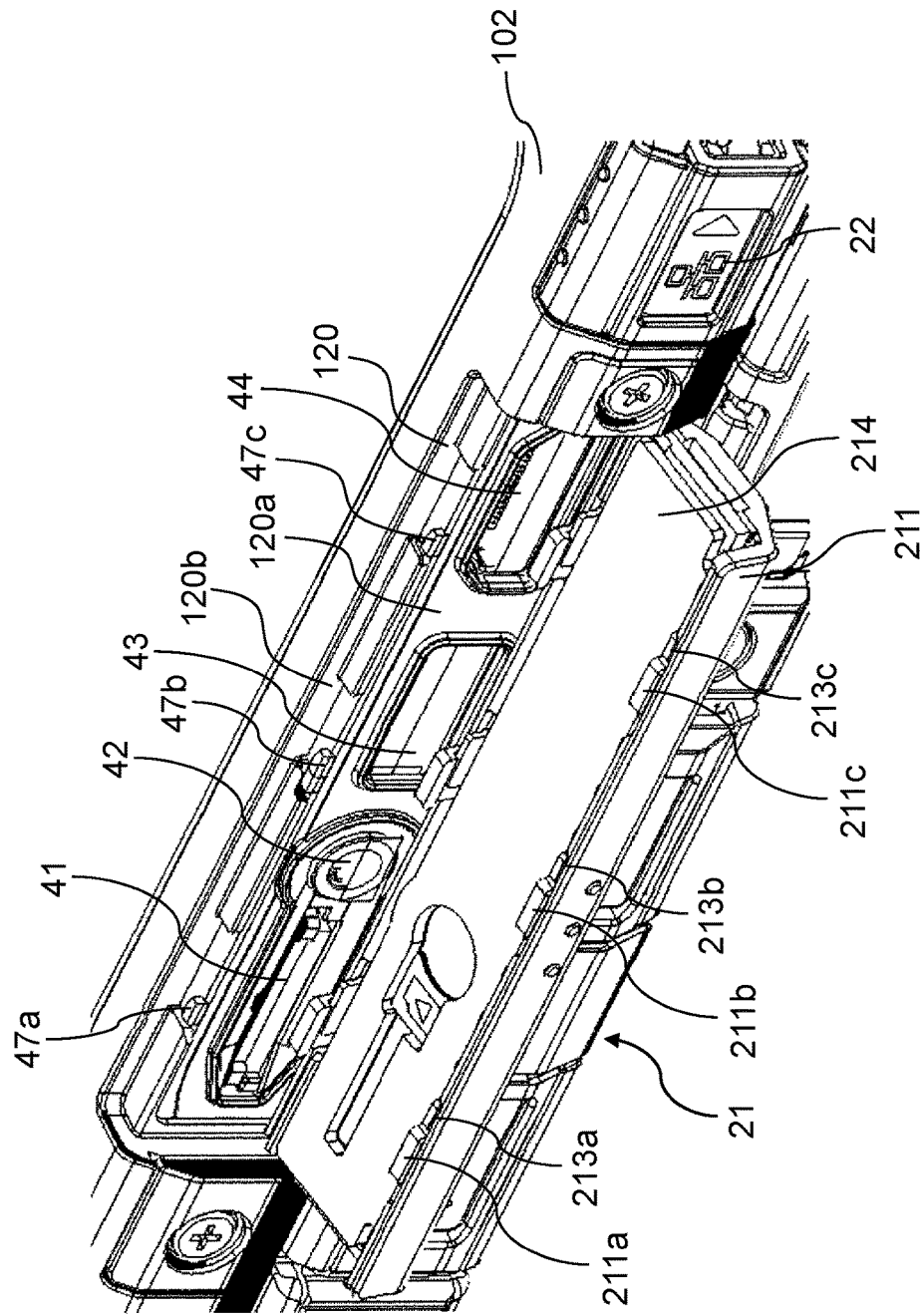
FIG. 13 is a view showing connection terminals provided on the second unit side of the information processing device when the composite cover is opened.
Figure 14:
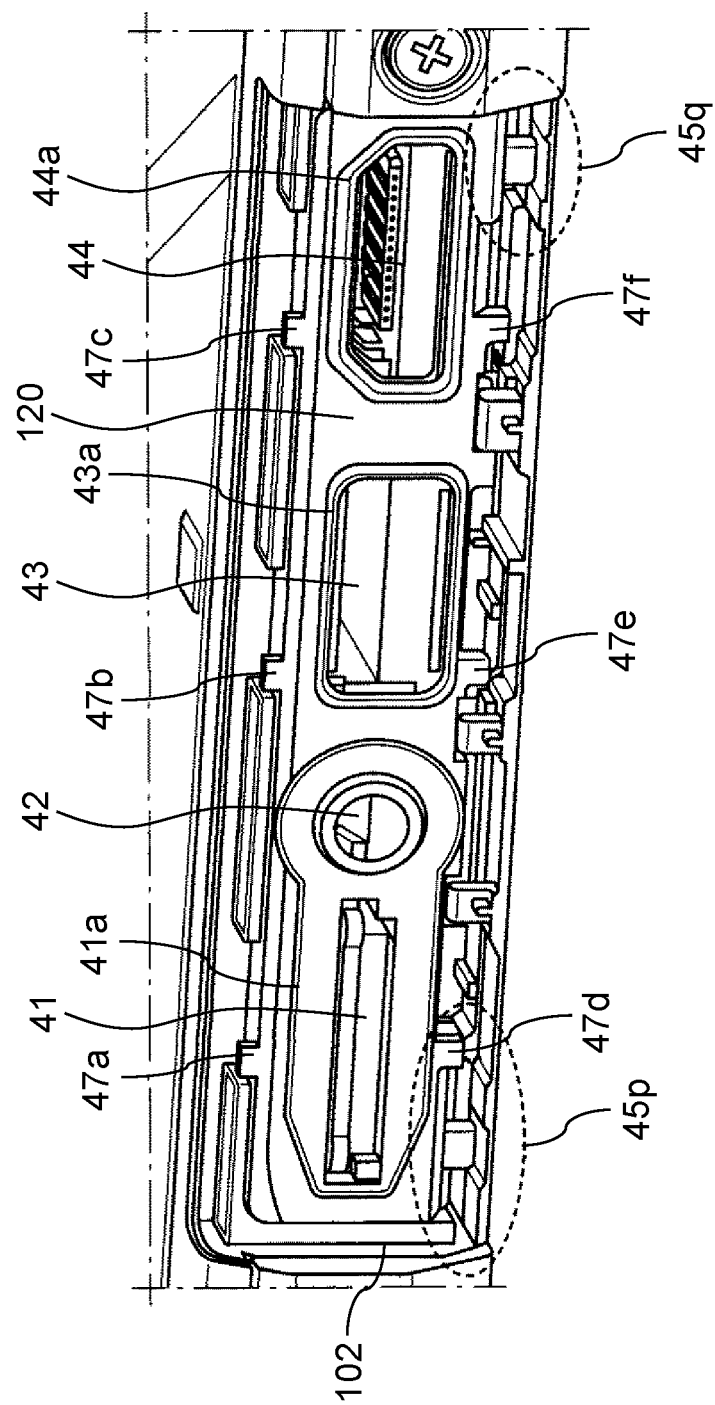
FIG. 14 is a view showing the connection terminals disposed on the second unit side of the information processing device.

FIG. 13 is a view explaining a state of the side surface of second unit 102 when composite cover 21 is opened. FIG. 14 is a view explaining a state of the side surface of second unit 102 when composite cover 21 is removed from second unit 102.

As shown in FIGS. 13 and 14, the memory card slot (an opening that houses the connection terminal for the memory card inside), the earphone/microphone terminal, the USB terminal, and the HDMI terminal are disposed on the side surface of information processing device 100. Rib 41a is provided around openings 41, 42 that respectively house the memory card slot and the earphone/microphone terminal. Further, ribs 43a and 44a are respectively provided around opening 43 of the USB terminal and opening 44 of the HDMI terminal. Further, mounting holes 45p, 45q of composite cover 21 are respectively provided below openings 41, 44 of the memory card slot and the HDMI terminal.

Projections 47a, 47b, 47c, 47d, 47e, 47f for locking the composite cover are provided in regions above and below a region provided with the memory card and the connection terminals. More specifically, rectangular parallelepiped projections 47a to 47c and 47d to 47f are respectively provided on upper surface 120b and a lower surface of second casing 120 orthogonal to surface 120a provided with memory card slot 41 and openings 42 to 44 of the connection terminals.

Figure 15:
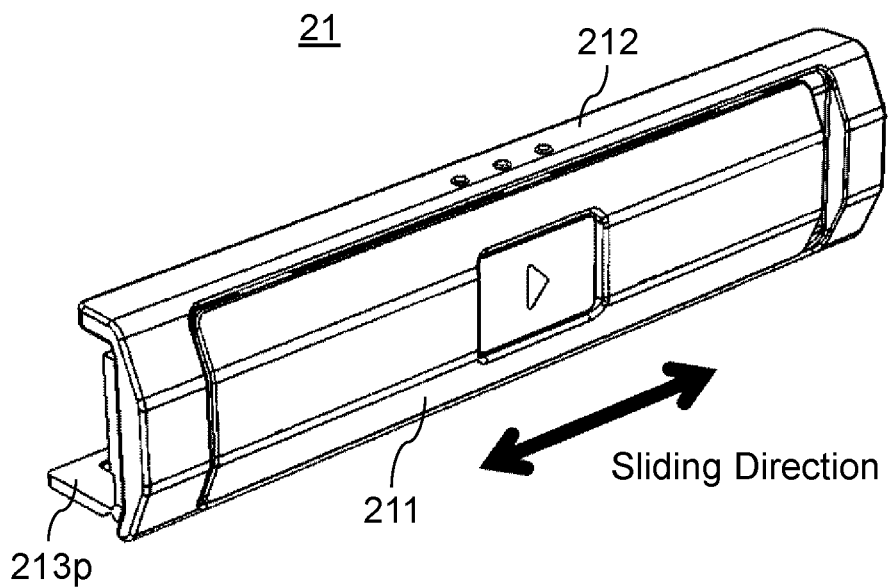
FIG. 15 is a perspective view of the composite cover.
Figure 16:
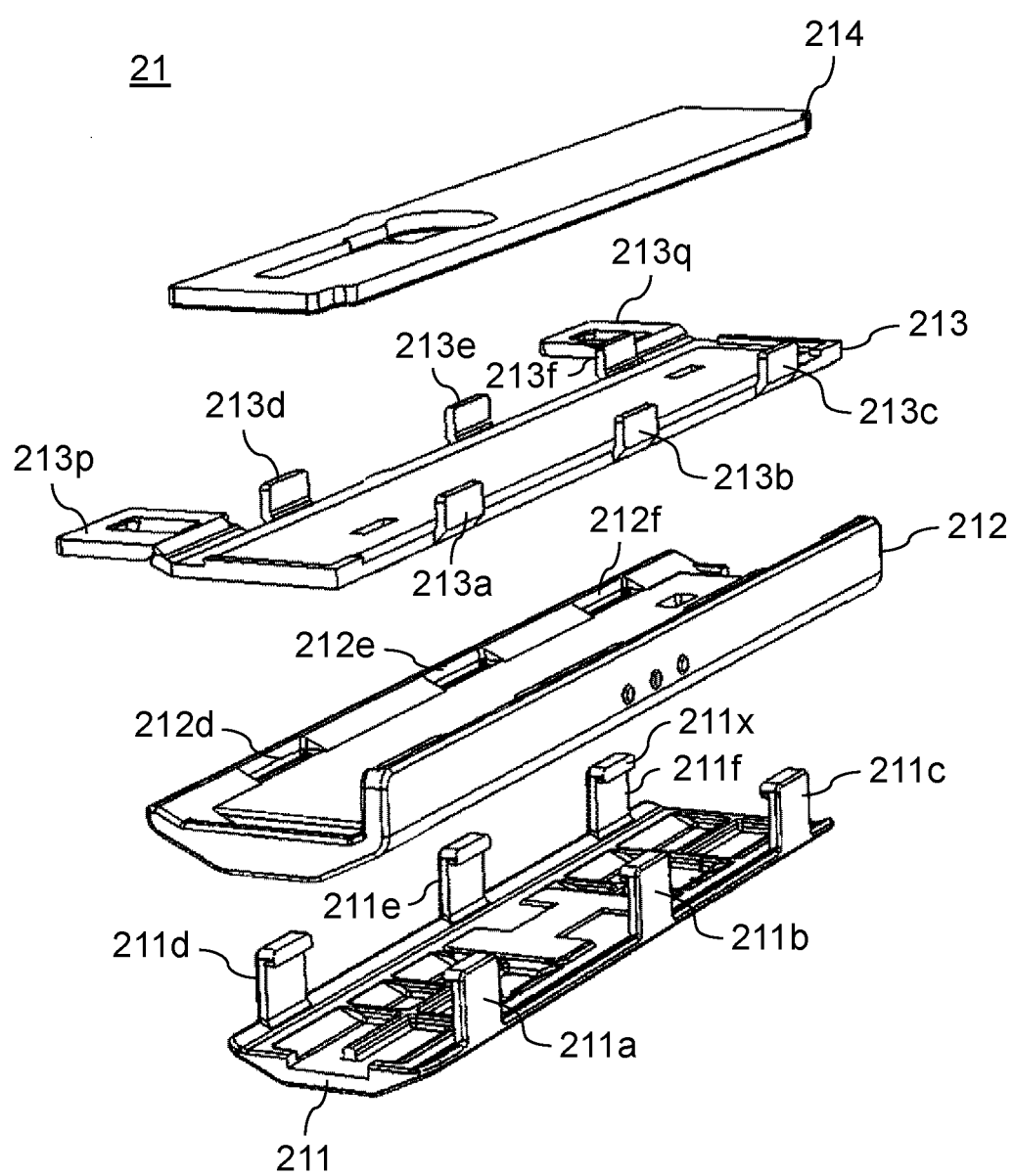
FIG. 16 is a developed view of the composite cover.

FIG. 15 is a perspective view of composite cover 21. FIG. 16 is a developed view of composite cover 21. As shown in FIG. 16, composite cover 21 includes slider 211, lid 212, fixing part 213, and water sealing member 214. Slider 211 includes, at both ends in a width direction, protrusions 211a to 211f that extend in a direction orthogonal to a principal surface of slider 211. Lock part 211x is formed at a tip of each of protrusions 211a to 211f. Lock part 211x juts out toward the opposing protrusion in a direction parallel to the principal surface of slider 211.

Lid 212 is provided with slits 212d, 212e, 212f in a longitudinal direction. In lid 212, three slits (hidden and not shown in FIG. 16) disposed parallel to slits 212d, 212e, 212f are provided at positions away from slits 212d, 212e, 212f in a width direction.

Fixing part 213 includes, at both ends in a width direction, six protrusions (for example, protrusion 213d) that extend in a direction orthogonal to a principal surface of fixing part 213. Moreover, fixing part 213 includes fixing pieces 213p, 213q for fixing composite cover 21 to second unit 102. Fixing pieces 213p, 213q are inserted in mounting holes 45p, 45q of second casing 120, and are fixed to second casing 120.

Water sealing member 214 is formed of urethane rubber or the like, and is mounted on fixing part 213.

Figure 17:
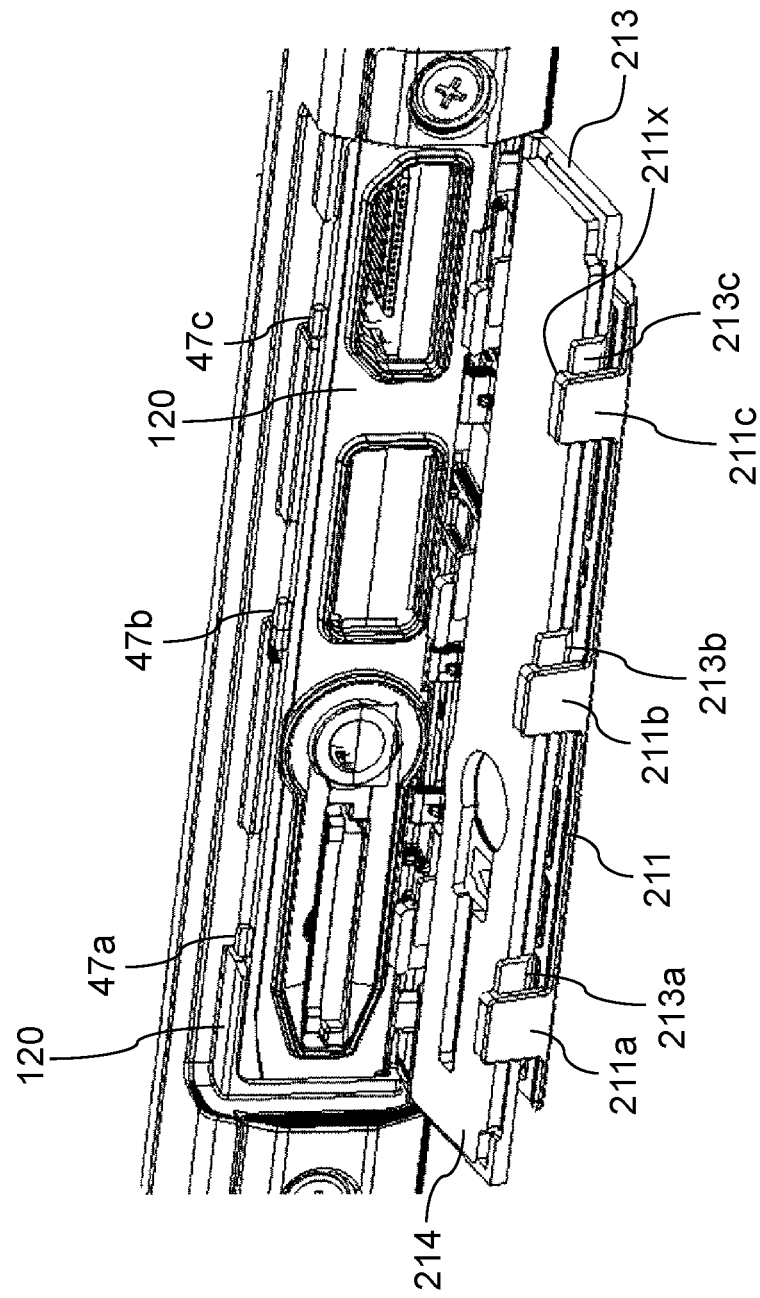
FIG. 17 is a view showing a state in which a lid of the composite cover is removed in the state shown in FIG. 13.

Respective protrusions 211a to 211f of slider 211, respective slits 212d to 212f and the like of lid 212, respective protrusions 213a to 213f of fixing part 213 are provided at mutually corresponding positions. Protrusions 211a to 211f of slider 211 pass through corresponding slits 212d to 212f and the like of lid 212, and are engaged with corresponding protrusions 213a to 213f of fixing part 213. In other words, lock parts 211x of protrusions 211a to 211f of slider 211 are respectively engaged with corresponding protrusions 213a to 213f of fixing part 213. With this configuration, slider 211, lid 212, and fixing part 213 are integrally coupled, thereby forming composite cover 21. FIG. 17 is a view showing a state in which lid 212 of composite cover 21 is removed in the state shown in FIG. 13. As shown in FIG. 17, lock parts 211x of protrusions 211a to 211f of slider 211 are respectively engaged with corresponding protrusions 213a to 213f of fixing part 213.

Lengths of slits 212d to 212f and the like of lid 212 and lengths of protrusions 213a to 213f of fixing part 213 are set at lengths such that slider 211 can slide in a longitudinal direction in a state in which slider 211, lid 212, and fixing part 213 are coupled.

A lock function of composite cover 21 having the above-described configuration is described.

In a state in which composite cover 21 is completely closed with respect to second casing 120 in second unit 102 (see FIGS. 2 and 12), slider 211 is slid in the longitudinal direction. Accordingly, composite cover 21 can be locked.

Specifically, protrusions 211a to 211f of slider 211 are moved by sliding slider 211 in the longitudinal direction. At this time, respective protrusions 211a to 211c, 211d to 211f of slider 211 are moved toward respective projections 47a to 47c, 47d to 47f provided in second casing 120. Then, lock parts 211x of respective protrusions 211a to 211c, 211d to 211f are eventually engaged with projections 47a to 47c, 47d to 47f of second casing 120. With this configuration, composite cover 21 is fixed to second casing 120 in a plurality of places at ends in the width direction by the movement of slider 211.

Figure 18:
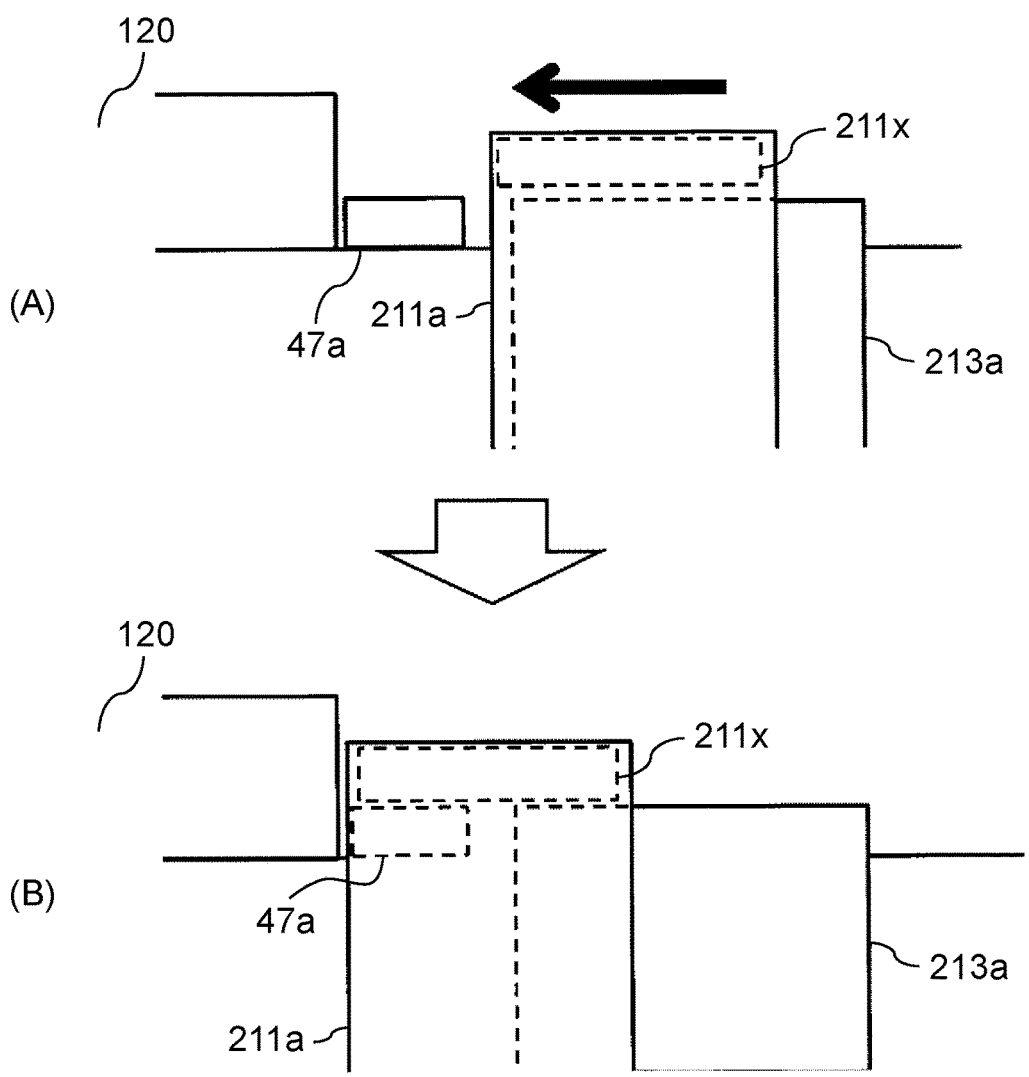
FIG. 18 is a view for explaining lock operation of the composite cover.

FIG. 18 is a view explaining a state in which lock part 211x of protrusion 211a of slider 211 and projection 47a of second casing 120 are engaged with the movement of slider 211. As shown in FIG. 18 (A), protrusion 211a of slider 211 is moved toward projection 47a by the movement of slider 211. Then, as shown in FIG. 18 (B), lock part 211x of protrusion 211a is engaged with projection 47a of second casing 120. With this configuration, composite cover 21 is fixed to second casing 120.

As described above, since composite cover 21 is fixed to second casing 120 in the plurality of places at the ends in the width direction, composite cover 21 is fixed to second casing 120 more firmly. Hence, it is possible to realize higher waterproof and dust-proof properties.

It should be noted that in the state in which composite cover 21 is completely closed with respect to second casing 120 of the second unit, water sealing member 214 mounted on composite cover 21 and the ribs provided around the openings of the connection terminals are in close contact with each other. With this configuration, the openings of the connection terminals are sealed, and the waterproof and dust-proof properties are secured.

[1-3. Effects Etc.]

As described above, information processing device 100 of the present exemplary embodiment includes first casing 110 having memory card slot 31 (an example of the opening that houses the connection terminal inside) and terminal cover 11a that closes memory card slot 31 such that the connection terminal is not exposed. Terminal cover 11a includes first lid 163a that closes memory card slot 31, fixing part 11c for fixing first lid 163a to first casing 110, and slider 161 mounted on the first lid 163a and slidable in a predetermined sliding direction. First lid 163a is coupled to fixing part 11c in the predetermined sliding direction. Slider 161 has projections 161a, 161b (an example of first engagement parts) provided at the end in the predetermined sliding direction and engagement parts 161c and 161d, 161e and 161f (an example of second engagement parts) respectively provided at the two ends in the direction orthogonal to the sliding direction. When slider 161 is located at a predetermined lock position in a state in which terminal cover 11a is closed, first casing 110 has lock holes 36a, 36b (an example of third engagement parts) engaged with projections 161a, 161b and projections 32c to 32f (an example of fourth engagement parts) engaged with engagement parts 161c and 161d, 161e and 161f.

With this configuration, since terminal cover 11a is fixed to first casing 110 in the plurality of places, terminal cover 11a can be in close contact with first casing 110 more firmly, and airtightness can be kept. For example, even if degrees of expansion of terminal cover 11a and first casing 110 are different due to a difference in coefficients of thermal expansion, since terminal cover 11a can be fixed in the plurality of places, terminal cover 11a can be in close contact with first casing 110 with a high degree of close contact. Accordingly, high waterproof and dust-proof performance can be obtained.

Further, slider 161 may include protrusions 161x, 161y that protrude in a direction orthogonal to a principal surface of the slider at each of two ends in the direction orthogonal to the sliding direction. At this time, engagement parts 161c and 161d, 161e and 161f are provided at tips of protrusions 161x, 161y. With this configuration, a length in the direction orthogonal to the sliding direction (the width direction) of terminal cover 11a can be reduced, and the terminal cover can be thinned.

Further, projections 32c to 32f provided in first casing 110 may be plate-shaped projections that extend in the direction parallel to surface 110a formed with the memory card slot on the first casing. Engagement parts 161c and 161d, 161e and 161f of terminal cover 11a may have openings into which the plate-shaped projections are inserted. Also, with this configuration, the length in the direction orthogonal to the sliding direction (the width direction) of terminal cover 11a can be reduced, and the terminal cover can be thinned.

Other Exemplary Embodiments

As above, the first exemplary embodiment is described as an illustration of a technique disclosed in the present application. However, the technique in the present disclosure is not limited to this first exemplary embodiment, and is also applicable to exemplary embodiments that are appropriately changed, replaced, added, omitted, or the like. Further, a new exemplary embodiment can be implemented by combining the respective components explained in the above-described first exemplary embodiment. Therefore, other exemplary embodiments are described below.

In the first exemplary embodiment, description is given of an example of the terminal cover that covers the predetermined connection terminal (the connection terminal for the memory card, the earphone/microphone terminal, the USB terminal, or the HDMI terminal). However, a kind of connection terminal covered by the terminal cover is not limited to the aforementioned kind. An idea about the terminal cover of the present disclosure can be applied to any kind of connection terminal.

The shape of the projection, the protrusion, the engagement part, or the like shown in the first exemplary embodiment is one example, and is not limited to the aforementioned shape. The projection, the protrusion, or the like may have another shape if an identical function is realized.

In the first exemplary embodiment, rib that is in close contact with water sealing member and seals an opening (insertion port) is formed in first casing 110. However, rib may be formed in a member other than first casing 110. In other words, the rib may be formed in any member if the rib can be in close contact with water sealing member and seal the opening (insertion port).

In the first exemplary embodiment, the so-called detachable type computer is described as an example of the electronic device. However, the idea about the terminal cover of the present disclosure can be applied to other kinds of electronic devices. For example, the idea of the present disclosure can be applied to an electronic device including connection terminals, such as a notebook type personal computer, a tablet terminal, a smartphone, a cell phone, or a digital camera.

As above, the exemplary embodiments are described as the illustration of the technique in the present disclosure. For that purpose, the attached drawings and the detailed description are provided.

Therefore, the components mentioned in the attached drawings and the detailed description may include not only components that are essential for solving the problems, but also components that are not essential for solving the problems to illustrate the above-described technique. Accordingly, those nonessential components should not be immediately recognized as essential just because those nonessential components are mentioned in the attached drawings or the detailed description.

Further, since the aforementioned exemplary embodiments illustrate the technique in the present disclosure, various changes, replacements, additions, omissions, or the like can be made in the claims and their equivalents.

The present disclosure is useful for an electronic device having a terminal cover that covers a connection terminal for connecting an external device, a power supply plug, or the like, and requiring waterproof and dust-proof properties to the terminal cover (for example, a notebook personal computer, a tablet terminal, a smartphone, a cell phone, or a digital camera).

What is claimed is:
1. An electronic device comprising:
a casing having a first opening which houses a first connection terminal inside and a second opening which houses a second connection terminal inside; and
a coupling cover that closes the first opening and the second opening such that the first connection terminal and the second connection terminal are not exposed,
wherein the coupling cover includes a first lid that closes the first opening, a second lid that closes the second opening, a fixing part has a fastener opening in a center for fixing the first lid and the second lid to the casing, a first slider mounted on the first lid and slidable in a predetermined sliding direction, and a second slider mounted on the second lid and slidable in the predetermined sliding direction,
the first lid and the second lid are coupled to the fixing part in the predetermined sliding direction, the fixing part is disposed between the first lid and the second lid,
the first slider has engagement parts provided at each of two ends of the first slider in a direction orthogonal to the predetermined sliding direction, and when the first slider is located at a first predetermined lock position in a state in which the first lid closes the first opening, the engagement parts of the first slider are engaged with engagement parts of the casing,
wherein the first slider includes protrusions that protrude in a direction orthogonal to a principal surface of the first slider at each of the two ends of the first slider in the direction orthogonal to the predetermined sliding direction, and the engagement parts of the first slider are provided at tips of the protrusions of the first slider.

2. The electronic device according to claim 1, wherein the engagement parts of the casing are plate-shaped projections that extend in a direction parallel to a surface formed with the first opening on the casing, and the engagement parts of the first slider have openings into which the plate-shaped projections are inserted.

3. The electronic device according to claim 1, wherein
a rib is provided around the first opening of the casing, and
the first lid is mounted with a water sealing member that is in close contact with the rib in the state in which the first lid closes the first opening.

4. The electronic device according to claim 1, wherein the first opening is disposed on a side surface of the electronic device.

5. The electronic device according to claim 1, wherein the electronic device is any of a notebook type personal computer, a tablet terminal, a smartphone, a cell phone, and a digital camera.

6. The electronic device according to claim 1, wherein
the first predetermined lock position is a position where the first slider is slid away from the fixing part.

7. The electronic device according to claim 1, wherein
the first lid is mounted with a water sealing member on a surface facing to the casing.

8. The electronic device according to claim 1, wherein
the second slider has engagement parts, and
when the second slider is located at a second predetermined lock position in a state in which the second lid closes the second opening, the engagement parts of the second slider are engaged with engagement parts of the second lid.

* * * * *